United States Patent [19]

Buddecke et al.

[11] Patent Number: 4,697,157

[45] Date of Patent: Sep. 29, 1987

[54] INHERENTLY FLAT SPECTRAL DENSITY PSEUDORANDOM NOISE GENERATOR

[75] Inventors: Charles L. Buddecke, Fullerton; Robert F. Graham, Jr., Yorba Linda, both of Calif.

[73] Assignee: Hughes Aircraft Company, Los Angeles, Calif.

[21] Appl. No.: 921,163

[22] Filed: Oct. 17, 1986

[51] Int. Cl.$^4$ .............................................. H03B 29/00
[52] U.S. Cl. ........................................ 331/78; 455/1; 342/14
[58] Field of Search ................... 331/78; 342/14, 200; 455/1

[56] References Cited

U.S. PATENT DOCUMENTS

| | | | |
|---|---|---|---|
| 3,659,219 | 4/1972 | Rueff, Jr. .............................. | 331/78 |
| 4,342,119 | 7/1982 | Seidl ...................................... | 455/1 |
| 4,644,299 | 2/1987 | Amoroso et al. ..................... | 331/78 |

Primary Examiner—Siegfried H. Grimm
Attorney, Agent, or Firm—Thomas A. Runk; Karambelas A. W.

[57] ABSTRACT

A pseudorandom noise generator (10) is disclosed which includes a maximum length sequence generator (13) for providing a digital signal having a pseudorandom sequence, modulating circuitry (17, 20, 25, 27, 33) responsive to the digital signal for providing a constantly changing modulation signal which changes linearly. In one embodiment, the modulation circuitry provides a sequence of linear ramps which remain within predetermined limits, and a voltage controlled oscillator (29) responsive to the modulation signal for providing a pseudorandom noise output VCOUT. The modulating circuitry causes inversion of the slope of the ramps when they reach the predetermined limits.

Also disclosed is a pseudorandom noise generator (110) which includes a maximum length sequency generator (133) for providing a digital signal having a pseudorandom sequence at a selectable rate, a digital counter (111) for providing a digital count signal, circuitry (119, 121, 123, 125, 127, 129, 131, 137, 139) for controlling the count direction of the digital count signal in response to the pseudorandom digital signal and for controlling the digital count signal to remain within predetermined limits, a digital-to-analog converter (115) for converting the digital count to an analog modulation signal, and a voltage controlled oscillator (117) responsive to the analog modulation signal for providing a noise output VCOUT.

28 Claims, 2 Drawing Figures

INHERENTLY FLAT SPECTRAL DENSITY PSEUDORANDOM NOISE GENERATOR

BACKGROUND OF THE INVENTION

The disclosed invention is directed to noise generating circuitry, and is more particularly directed to a pseudorandom noise generator which utilizes digital modulation to produce a pseudorandom noise output which has a relatively wide spectral band, a relatively flat in-band spectrum, a substantially constant probability density function across its bandwidth, substantially constant dwell times for fixed frequency intervals within its bandwidth, and substantially constant revisits for such fixed frequency intervals.

Pseudorandom noise generators are utilized in various applications such as system testing, secure communications, and electronic jamming. Depending on the application, certain characteristics of the output noise signal may be desirable. For example, a relatively wideband pseudorandom noise output may be advantageous for jamming a class of victim receivers which are known to be operating within such relatively wide bandwidth. A pseudorandom noise generator that provides such a relatively wideband noise output also be useful for other uses such as a noise-like channel sounder or as a spread spectrum source for a spread spectrum communications system.

Considerations with known wideband pseudorandom noise generators include the lack of constant probability density across the bandwidth of the noise output. That is, different frequencies of the noise output have different probabilities of occurrences. Such lack of a constant probability density reduces the effectiveness of applications such as electronic jamming and may affect the apparent randomness of the output noise signal.

Further considerations with known pseudorandom noise generators involve characteristics known as "dwell time" and "revisits" which are based on dividing the noise output bandwidth into a plurality of fixed frequency intervals of the same width (e.g., 5 MHz) which are also known as "resolution cells." Dwell time refers to the long term average time interval that the noise output is within a specified fixed frequency interval or resolution cell. Revisits refers to the long term average number of times per unit time that the noise output is in a specified fixed frequency interval.

With known pseudorandom noise generators, dwell time for a specified fixed frequency interval depends on the location of the specified fixed frequency interval within the noise output bandwidth. Also, the number of revisits for a specified fixed frequency interval depends on the location of the specified fixed frequency interval within the noise output bandwidth.

The variation in dwell time and number of revisits are important considerations in applications such as receiver jamming. Such variation reduces the apparent randomness of the noise output, and may allow for increased detection of the jamming function since patterns of frequency changes may be detected. Further, such variations reduce the predictability of the effects of jamming on receivers whose locations within the noise output bandwidth are unknown.

SUMMARY OF THE INVENTION

It would therefore be an advantage to provide a pseudorandom noise generator which provides for a noise output having a constant probability density and which allows for different clock rates so that the generator may be used for different purposes without having to replace circuitry.

Still another advantage would be to provide a pseudorandom noise generator which generates a pseudorandom noise output having substantially constant dwell times across its noise output bandwidth.

A further advantage would be to provide a pseudorandom noise generator which generates a pseudorandom noise output having a substantially constant number of revisits across its noise output bandwidth.

The foregoing and other advantages and features of the invention are provided in a pseudorandom noise generator which includes a maximum length sequence (MLS) generator for providing a digital signal having a pseudorandom sequence at a selectable clock rate, modulating circuitry responsive to the digital signal for providing a modulation signal comprising a sequence of linear ramps which remain within predetermined limits, and a voltage controlled oscillator (VCO) responsive to the modulation signal for providing a VCO noise output. The modulation signal has a substantially constant probability density function between the predetermined ramp limits, and provides for a VCO noise output having a relatively constant output spectrum resembling white noise. For a plurality of fixed frequency intervals of the same fixed width and located within the bandwidth of the VCO noise output, substantially constant dwell times and a substantially constant number of revisits are provided. The clock rate is selectable for different rates for different purposes while maintaining the substantially constant probability density function of the VCO noise output, and the substantially constant dwell times and revisits.

A further aspect of the invention is directed to a pseudorandom noise generator which includes a maximum length sequence generator for providing a digital signal having a pseudorandom sequence at a selectable rate, a digital counter for providing a digital count signal, circuitry for controlling the count direction of the digital count signal in response to the pseudorandom digital signal and for controlling the digital count signal to remain within predetermined limits, a digital-to-analog converter for converting the digital count to an analog modulation signal, and a voltage controlled oscillator (VCO) responsive to the analog modulation signal for providing a VCO noise output.

BRIEF DESCRIPTION OF THE DRAWINGS

The advantages and features of the disclosed invention will readily be appreciated by persons skilled in the art from the following detailed description when read in conjunction with the drawings wherein.

DETAILED DESCRIPTION OF THE PREFERRED EMBODIMENTS

Figure 1:
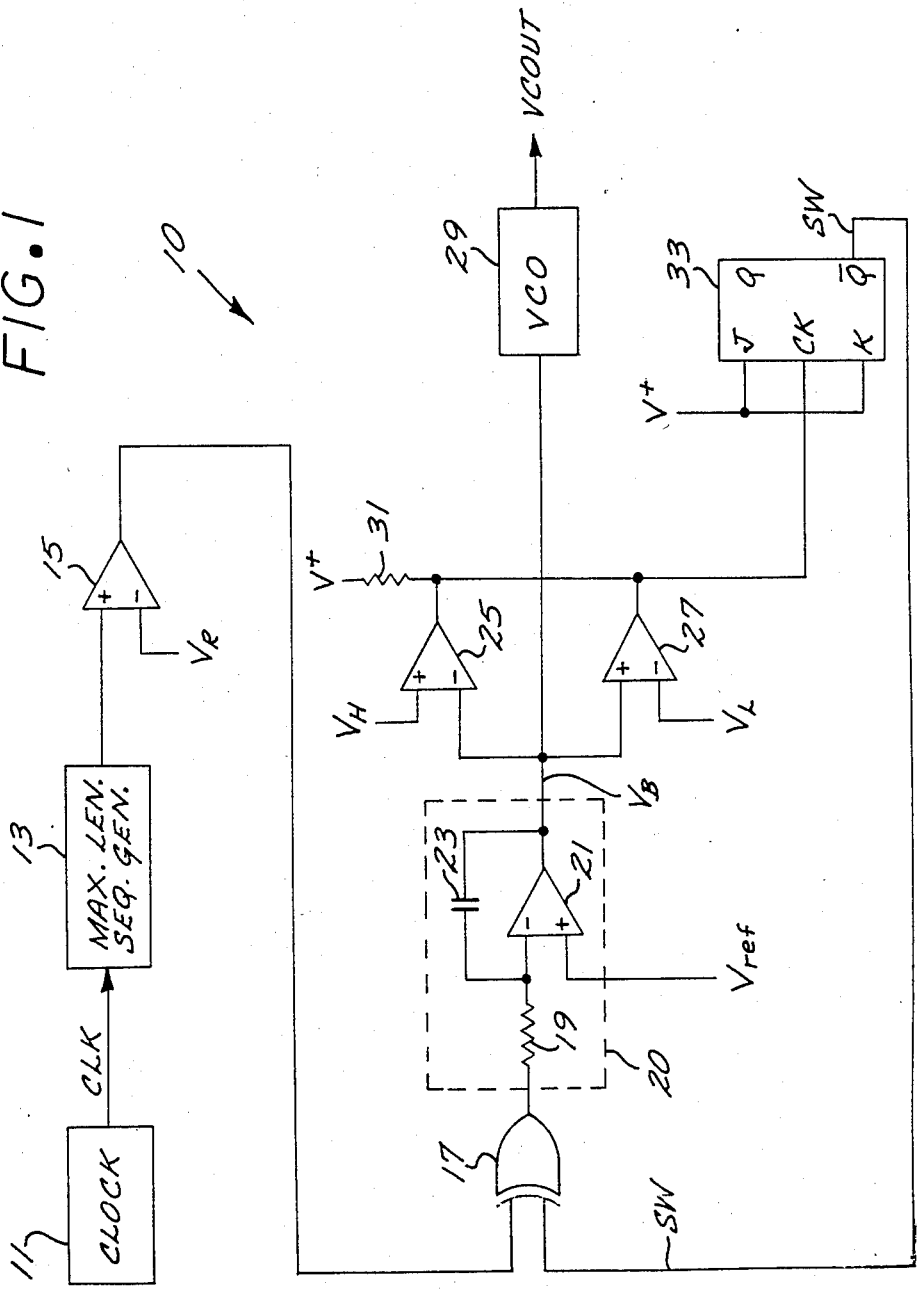
FIG. 1 is a schematic diagram of the disclosed pseudorandom noise generator.

Referring now to FIG. 1, shown therein is a pseudorandom noise generator 10 in accordance with the invention which includes a clock signal generator 11 for generating a clock signal CLK having a selectable frequency. The clock signal CLK is provided to a maximum length sequence (MLS) generator 13 which provides as its output a digital signal that includes a pseudorandom sequence of bits. Maximum length sequence generators are well known in the art and generally include cascaded shift register stages with appropriate feedback circuitry. Maximum length sequence generators provide digital output sequences that have patterns which repeat only after a very large number of output bits. For example, an MLS generator having 23 shift register stages may be configured to provide an output sequence which repeats only after 8,388,607 output bits and is therefore referred to as having a code length of 8,388,607.

By way of example, the output of the maximum length sequence generator 13 is a series of digital pulses having a voltage level of V1 or V2, where V1 is greater than V2.

The output of the maximum length sequence generator 13 is provided to the non-inverting input of a voltage comparator 15 which has its inverting input coupled to a voltage reference $V_R$. The voltage comparator 15 is utilized as a buffer to provide appropriate logic levels to the circuitry following it. Thus, for example, if the maximum length sequence generator 13 provides an output having TTL levels while the other circuitry following the voltage comparator 15 utilizes CMOS logic levels, the voltage comparator 15 could be a CMOS voltage comparator. The voltage comparator is, of course, not needed if the maximum length sequence generator 13 provides an output having logic levels appropriate for the circuitry following the voltage comparator.

The output of the voltage comparator 15 is coupled to one of the two inputs of an exclusive-OR gate 17. The other input to the exclusive-OR gate 17 receives a feedback signal SW provided by other circuitry following the exclusive-OR gate 17. The output of the exclusive-OR gate 17 is coupled to one terminal of a resistor 19 which has its other terminal coupled to the inverting input of an operational amplifier 21. The non-inverting input of the operational amplifier 21 is coupled to a voltage reference $V_{ref}$ which is set at a predetermined level as specified further herein. An integrating capacitor 23 is coupled between the output of the operational amplifier 21 and its inverting input. The resistor 19, the operational amplifier 21, and the integrating capacitor 23 form an integrator 20 which provides an integrator output $V_B$.

The integrator output $V_B$, as provided by the integrator 20, is coupled to the inverting input of a voltage comparator 25 which has its non-inverting input coupled to a reference voltage $V_H$. The integrator output $V_B$ of the integrator 20 is also coupled to the non-inverting input of another voltage comparator 27 which has its inverting input coupled to a reference voltage $V_L$.

The reference voltage $V_H$ is greater than the reference voltage $V_L$, while the reference voltage $V_{ref}$ is centered between the digital logic levels (e.g., CMOS) utilized by the exclusive-OR gate 17.

The output of the integrator 20 provides the baseband waveform for modulating a voltage controlled oscillator (VCO) 29 which provides an output signal VCOUT. The VCOUT signal provided by the VCO 29 is the noise output of the pseudorandom noise generator 10. Ideally, the VCO 29 is linear in both amplitude and slope; however, this is not a necessary requirement.

The outputs of the voltage comparators 25, 27 are connected together and are coupled via a resistor 31 to a positive voltage V+. The connected outputs of the voltage comparators 25, 27 further provide the input to the clock input of a JK flip-flop 33. The J and K inputs of the JK flip-flop 33 are coupled together to the positive voltage V+. The $\overline{Q}$ output of the JK flip-flop 33 provides the feedback signal SW to the exclusive-OR gate 17.

In operation, the output $V_B$ of the integrator 20 is at any given time a ramp having a positive or negative going slope. The absolute value of the slope is constant and is controlled by the value of the integrating capacitor 23, while the direction (i.e., positive or negative) of the slope is controlled by the state of the output of the exclusive-OR gate 17. If the output of the exclusive-OR gate 17 is high, the integrator ramp output $V_B$ has a negative slope. If the output of the exclusive-OR gate 17 is low, the integrator ramp output $V_B$ has a positive slope. Thus, the output $V_B$ of the integrator 20 is a sequence of ramps which have positive or negative slopes.

The output of the exclusive-OR gate 17 is controlled by the level shifted pseudorandom sequence provided by the voltage comparator 15, and by the feedback signal SW from the JK flip-flop 33. When the feedback signal SW is high, the output of the exclusive-OR gate 17 is an inverted replica of the signal provided by the voltage comparator 15. When the feedback signal SW is low, the output of the exclusive-OR gate 17 is a non-inverted replica of the output of the voltage comparator 15. Effectively, when the feedback signal SW provided by the JK flip-flop 33 changes state, it causes reversal of the polarity of the pseudorandom sequence provided by the exclusive-OR gate 17.

So long as the integrator output $V_B$ is between the reference voltages $V_H$ and $V_L$, the output of the JK flip-flop 33 does not change and the direction of the ramp output is controlled solely by the state of the output of the voltage comparator 15. However, when the integrator output $V_B$ provided by the integrator 20 exceeds the reference $V_H$ or goes below the reference $V_L$, the output of the JK flip-flop 33 changes state. When the output of the JK flip-flop 33 changes state, the polarity of the pseudorandom sequence provided by the output of the exclusive-OR gate 17 reverses. The output $V_B$ will therefore change its ramp direction for the purpose of remaining between the reference voltages $V_H$ and $V_L$.

Thus, the voltage comparators 25, 27 and the JK flip-flop 33 cooperate to maintain the output $V_B$ of the integrator 20 between predetermined limits as set by the reference voltages $V_H$ and $V_L$. Moreover, the voltage comparators 25, 27 and the flip-flop 33 prevent the integrator output $V_B$ from remaining at the reference voltages for excessive amounts of time.

By these features, a VCO output of constant probability density results. The VCO 29 output is not completely dependent upon the pseudorandom sequence provided by the output of the voltage comparator 15, but is further controlled by the JK flip-flop 33 and the exclusive-OR gate 17. The VCO output does not remain at either of the frequencies corresponding to reference voltages $V_H$ and $V_L$, but changes since the voltage comparators 25, 27, the JK flip-flop 33 and the exclusive-OR gate 17 cooperate to cause the slope of the integrator ramp output $V_B$ to invert when the integrator output $V_B$ reaches either of the predetermined limits $V_H$ or $V_L$. Thus, linearity is maintained across the VCO 29 output spectrum. Although the VCO 29 output frequencies will be bounded within a certain selected spectrum, the linearity and pseudorandomness within that spectrum is maintained. There will be no concentration of energy at the band edge frequencies since immediate slope inversion occurs when the output $V_B$ of the integrator 20 reaches one of the voltage references $V_H$ and $V_L$.

The noise output VCOUT has the following spectral characteristics. It has a 3 dB bandwidth that is defined by the voltage limits of the input signal $V_B$ provided to the VCO 29, which limits are determined by the reference voltages $V_H$ and $V_L$. Thus, the lower 3 dB frequency, denoted $f_1$ for reference, is the frequency that would be generated by the VCO 29 in response to a steady state voltage corresponding to the reference voltage $V_L$; and the higher 3 dB frequency, denoted $f_2$ for reference, is the frequency that would be generated by the VCO 27 in response to a steady state voltage corresponding to the reference voltage $V_H$. The 3 dB bandwidth would therefore be $(f_2-f_1)$.

As discussed previously, the output $V_B$ of the integrator 20 is at any given time a positive or negative going linear ramp. Further, the output $V_B$ is controlled to remain between the reference voltages $V_L$ and $V_H$ and avoids being at the reference voltages for excessive amounts of time. As a result, the probability density function of the integrator 20 is substantially constant over its output range. As a result of the substantially constant probability density function, the noise output VCOUT has a substantially constant probability density function within its 3 dB bandwidth. Also, the noise output VCOUT provided by the VCO 29 has a relatively flat spectral characteristic over its 3 dB bandwidth and has the appearance of white noise. The output VCOUT also has a constant carrier envelope (i.e., the signal VCOUT has a constant carrier signal envelope for different frequencies within such bandwidth).

The pseudorandom noise output VCOUT provided by the pseudorandom noise generator 10 further has the following advantageous "dwell time" and "revisit" characteristics which are based on dividing the bandwidth of the noise output VCOUT into a plurality of fixed frequency intervals of the same width which are also referred to as "resolution cells". Specifically, the pseudorandom noise output generated by the pseudorandom noise generator 10 provides for substantially constant dwell times. That is, the dwell time for a fixed frequency interval is substantially the same for any location of the fixed frequency interval within the bandwidth of the noise generator output.

Further, the pseudorandom noise output generated by the pseudorandom noise generator 10 provides for a substantially constant number of revisits for each of the fixed frequency intervals. That is, the number of revisits for a fixed frequency interval is substantially the same for any location of the fixed frequency interval within the 3 dB bandwidth of the noise generator output.

The substantially constant dwell times and the substantially constant numbers of revisits provide the following advantages. The apparent randomness of the noise output VCOUT is enhanced, thereby reducing the detectability of a jamming signal based on the noise output. By the use of a maximum length sequence generator which repeats only after an extended period, the predictability of the next VCO output frequency is substantially reduced. Further, the characteristics of the noise output across its bandwidth are known to be substantially constant which allows for more effective jamming. Specifically, the effect of jamming is effectively predicted even if the location of the victim receiver bandwidth within the noise output bandwidth is not known. That is, the characteristics of the jamming signal may be optimized without the necessity of requiring more information about the specific frequencies utilized by the victim receiver.

The constant probability density function of the noise output, and the constant dwell time and number of revisits are maintained with variation of the rate of the clock signal CLK. However, for jamming applications, the clock rate should be chosen so as to maintain the apparent randomness of the noise output so that it is not detectable as an intended jamming signal. For example, if the clock rate is too slow, the noise output will be detected as a sweep signal, (i.e., a signal that merely sweeps back and forth across the spectrum of its bandwidth). If the clock rate is too fast, then the noise output will ocassionally spend continuous amounts of time in the proximity of the 3 dB frequencies.

As indicated previously, the slope of the output $V_B$ of the integrator 20 is constant and is determined by the integrating capacitor 23. More specifically, the slope is selected pursuant to the specific application of the pseudorandom noise generator 10. For example, for jamming applications, the slope is selected on the basis of the desired effect on victim receivers.

As a specific example for selecting the slope, for radar victim receivers (which look for returns of an associated transmitter signal) it may be desired that the victim receivers receive apparent target returns. For such result, it may be appropriate to have a dwell time that approximately corresponds to the pulse width of the transmitter signal associated with the victim receiver. Since such transmitter signal pulse width is inversely related to the victim receiver bandwidth, the appropriate dwell time for the jamming signal is approximately the inverse of the victim receiver bandwidth.

Figure 2:
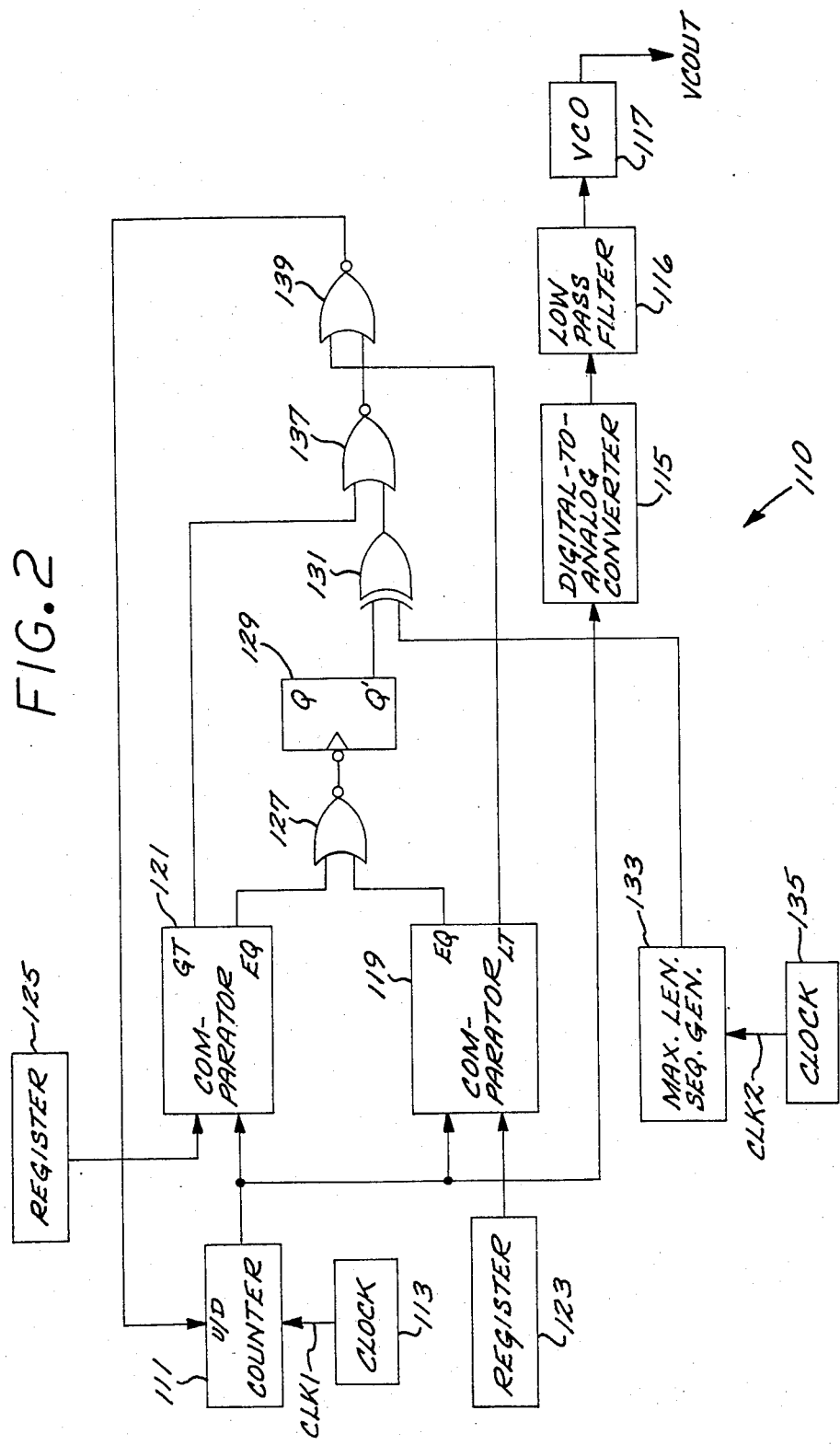
FIG. 2 is a schematic diagram of a further embodiment of the disclosed pseudorandom noise generator.

Referring now to FIG. 2, shown therein is a digital implementation of a pseudorandom noise generator 110 in accordance with the invention which includes a synchronous up/down counter 111 that is clocked by a clock signal CLK1 generated by a clock generator 113. The up/down counter 111 provides an up count when a low logic level is coupled to its up/down input (U/D), and provides a down count when its U/D input receives a high logic level.

The count output of the up/down counter 111 is coupled to a digital-to-analog converter (DAC) 115 which converts the digital count value to an analog signal. The analog output of the DAC 115 is filtered by a low pass filter 116. The output of the low pass filter 116 is provided as the baseband signal for modulating a voltage control oscillator (VCO) 117 which provides the noise output VCOUT of the noise generator 110. Preferably, the VCO 117 is linear in both amplitude and slope, although that is not a necessary requirement.

The output of the up/down counter 111 is further coupled to the respective first data inputs of magnitude comparators 119, 121. A register 123 provides a second data input to the magnitude comparator 119, and another register 125 provides a second data input to the magnitude comparator 121. By way of example, the registers 123, 125 may be respective banks of DIP switches or shift registers that are loaded with appropriate information. As discussed more fully herein, the registers 123, 125 define the respective minimum and maximum counts desired for the count output of the up/down counter 111.

The magnitude comparator 119 includes an EQUAL TO output (EQ) which is high when both of its data inputs are equal in magnitude. The magnitude comparator 119 further includes a LESS THAN output (LT) which is high when the count output of the up/down counter 111 is less than the data in the register 123.

The magnitude comparator 121 includes an EQUAL TO output (EQ) which is high when both of its data inputs are equal in magnitude. The magnitude comparator 121 further includes a GREATER THAN output (GT) which is high when count output of the up/down counter 111 is greater than the data in the register 125.

The respective EQUAL TO outputs (EQ) of the magnitude comparators 119, 121 are provided as inputs to a NOR gate 127 which has its output coupled to the clock input of a JK flip-flop 129. The J and K inputs of the JK flip-flop 129 are coupled to a high logic level. The inverted output Q' of the JK flip-flop 129 is provided as one input to a two-input exclusive-OR gate 131. The other input to the exclusive-OR gate 131 is provided by a maximum length sequence (MLS) generator 133. The MLS 133 is clocked by a clock generator 135 which generates a clock signal CLK1 having a selectable frequency. The frequency of the clock signal CLK1 provided by the clock generator 113 for the up/down counter 111 is higher than the clock signal CLK2 provided by the clock generator 135 for the MLS generator 133. For example, the frequency of the clock signal CLK1 may be about 50 times the frequency of the clock signal CLK2.

The combination of the up/down counter 111 and the DAC 115 functions similarly to the integrator 20 in the previous embodiment. The up/down counter 111 provides a series of continuously increasing or decreasing digital values at a rate established by its associated clock 113. The DAC 115 changes that series of digital values into a series of analog signals for modulating the VCO 117. The continuously increasing or decreasing analog signals correspond to the ramps provided by the integrator 20. In the preferred embodiment, the clock 113 frequency is variable. In one embodiment, the frequency of the clock 113 is under hardware control and in another embodiment, the frequency of the clock 113 may be under software control. The frequency of the clock 113 controls the slope of the ramps. The higher the frequency, the higher is the absolute value of the slope. Conversely, the lower the frequency, the lower the absolute value of the slope. As will be noted, this is analogous to the integrator 20 in FIG. 1.

This feature of control over the absolute value of the slope results in flexibility and versatility for the invention. Different applications for the invention may function more efficiently with different slopes used. For example, in a jamming application, it may be advantageous to use a relatively low absolute value slope or a relatively high absolute value slope depending on the victim receiver. In the case of a short pulse radar, a slope with a high absolute value would be more efficient where in the case of a long pulse, or long range radar, a slope with a lower absolute value would be more efficient. The invention provides the flexibility of changing the slope to optimize the performance.

As in the first embodiment, the slope of the ramp signal provided to the VCO 117 is controlled to be positive or negative in this embodiment. The primary slope control is provided by the maximum length sequence (MLS) generator 133 and its associated clock 135 which provides CLK2. As described previously, the MLS generator 133 provides a digital signal including a pseudorandom sequency of bits. This digital signal is coupled to the up/down input of the up/down counter 111 through the series of gates 131, 137, 139 as will be more fully described below. By coupling the output of the MLS generator 133 to the up/down input of the up/down counter 111, the output of the MLS generator 133 is a control signal which controls the direction of the count of the up/down counter 111 and therefore controls the value of the digital signal provided to the DAC 115.

By selecting the frequency of the MLS generator clock 135 to be less than that of the U/D counter clock 113, the U/D counter 111 is permitted to output a series of sequential digital values to the DAC 115 before receipt of the next digital value in the control signal from the MLS generator 133 which may cause the direction of the slope to change. By this arrangement, the digital output of the U/D counter will resemble the ramps provided by the integrator 20 in the previous embodiment. As discussed above, the DAC 115 is used to transform those digital ramps into analog ramps for use by the VCO 117. By changing the frequency of the clock 135 in relation to the frequency of the clock 113, the length of the ramps may be controlled.

The output of the exclusive-OR gate 131 is provided as an input to a two input NOR gate 137. The other input to the NOR gate 137 is provided by the GREATER THAN output (GT) of the magnitude comparator 121. The output of the NOR gate 137 is provided as an input to a two input NOR gate 139. The other input to the NOR gate 139 is provided by the LESS THAN output (LT) of the magnitude comparator 119. The output of the NOR gate 139 is coupled to the up/down input (U/D) of the up/down digital counter 111.

The operation of the up/down counter 111 is more readily understood by initially considering the situation where the count output of the up/down digital counter 111 is greater than the minimum count set by the register 123 and less than the maximum counter set by the register 125. The LESS THAN output of the magnitude comparator 119 is low, and the GREATER THAN output of the magnitude comparator 121 is also low. As a result, each of the NOR gates 137, 139 receives a low input. The NOR gate 137 therefore inverts the input it receives from the exclusive-OR gate 131, and the NOR gate 139 inverts the input it receives from the NOR gate 137. The output of the NOR gate 139 therefore follows the logical state of the output of the exclusive-OR gate 131. Thus, the count direction of the up/down counter 111 is controlled by the output of the exclusive-OR gate 131 so long as the count output of the counter 111 remains between the minimum and maximum limits set by the registers 123, 125.

The output of the exclusive-OR gate 131 is controlled by the pseudorandom sequence provided by the maximum length sequence generator 133, and by the Q' output of the JK flip-flop 129. When the Q' output of the JK flip-flop 129 is high, the output of the exclusive-OR gate 131 is an inverted replica of the signal provided by the MLS generator 133. When the Q' output of the JK flip-flop 129 is low, the output of the exclusive-OR gate 131 is a non-inverted replica of the output of the MLS generator 133. Effectively, when the Q' output of the JK flip-flop 129 changes state, it causes reversal of the polarity of the pseudorandom sequence provided by the exclusive-OR gate 131.

So long as the count output of the up/down counter 111 remains greater than the data in the register 123 and less than the data in the register 125, the Q' output of the JK flip-flop 129 does not change and the count direction of the count output is controlled solely by the state of the output of the MLS generator 133.

However, when the count output of the up/down counter 111 equals the data in the register 123, the EQUAL TO output of the comparator 119 goes high, causing the Q' output of the JK flip-flop 129 to change state. When the output of the JK flip-flop 129 changes state, the polarity of the pseudorandom sequence provided by the output of the exclusive-OR gate 131 reverses. The count direction of the up/down counter 111 will therefore change direction.

When the count output of the up/down counter equals the data in the register 125, the EQUAL TO output of the comparator 121 goes high, causing the Q' output to change state. When the JK flip-flop 129 changes state, the polarity of the pseudorandom sequence provided by the output of the exclusive-OR gate 131 reverses. The count direction of the up/down counter 111 will therefore change direction.

It should be readily understood that the comparator 119, 121 and the registers 123, 125 cooperate to maintain the count output of the up/down counter 111 between the minimum and maximum values respectively stored in the registers 123, 125.

In the unlikely situation where the count output of the up/down counter 111 becomes less than the value in the register 123, or becomes greater than the value in the register 125, the NOR gates 137, 139 cooperate to control the count direction to force the count output to be between the minimum and maximum values.

If the LESS THAN output of the comparator 119 goes high, the output of the NOR gate 139 remains low so long as the LESS THAN output of the comparator 119 remains high. Thus, the up/down counter 111 is controlled to up count so long as the LESS THAN output of the comparator 119 remains high.

If the GREATER THAN output of the comparator 121 goes high, the output of the NOR gate 137 remains low so long as the GREATER THAN output of the comparator 121 remains high. Both inputs to the NOR gate 139 are therefore low and its output remains high so long as the GREATER THAN output of the comparator 121 is high. Thus, the up/down counter 111 is controlled to down count so long as the GREATER THAN output of the comparator 121 remains high.

The magnitude comparators 119, 121 and the NOR gates 137, 139 effectively override the count direction control provided by the exclusive-OR gate 131.

In use, the data values stored in the registers 123, 125 are selected to respectively set the lower and upper −3 dB passband frequencies of the noise output VCOUT provided by the VCO 117.

It should be noted that the output of the DAC 115 varies in a stepped manner whereby its output waveform resembles a sequence of positive and negative going staircase sections. The low pass filter 116 smoothes the output of the DAC 115 so that the filtered output provided by the low pass filter 116 resembles the ramps provided by the integrator 20 of the noise generator 20 of FIG. 1. Although the output of the low pass filter 116 may not include precise linear ramps, it changes in a uniform and linear manner like linear ramps, and the resulting noise output VCOUT has the same characteristics as the noise output resulting from the linear ramps of the integrator of FIG. 1.

It should further be noted that the output of the DAC 115 may be utilized to directly modulate the VCO 117. While the output of the DAC 115 varies in a stepped manner, it varies in a uniform and linear manner. Thus, the resulting noise output VCOUT would have the same characteristics as the noise output resulting from the linear ramps of the integrator 20 of FIG. 1.

The foregoing has been a disclosure of a pseudorandom noise generator which provides a noise output having a constant probability density function for different selectable clock rates without requiring changes to the circuitry for different clock rates. The noise output generated by the disclosed pseudorandom noise generator further has substantially constant dwell times across its bandwidth (i.e., for fixed frequency intervals at different locations), and a substantially constant number of revisits for each of the fixed frequency intervals.

As indicated previously, the disclosed pseudorandom noise generator may be utilized in secure communications systems, system testing applications, as well as in the discussed receiver jamming applications. Specifically as to communications applications, due to the linearity of the invention, a communications spectrum provided with the invention appears white noise-like, whereby its detectability is reduced.

Although the foregoing has been a description and illustration of specific embodiments of the invention, various modifications and changes thereto can be made by persons skilled in the art without departing from the scope and spirit of the invention as defined by the following claims.

What is claimed is:

1. A noise generator comprising:
    clock means for providing a clock signal having a selectable frequency;
    means responsive to said clock signal for providing a digital signal having a pseudorandom sequence at a rate controlled by the clock means;
    modulation means for providing a linearly changing modulation signal having a slope, the modulation means also for being responsive to said pseudorandom digital signal wherein the direction of the slope is controlled by said pseudorandom digital signal;
    control means for controlling said modulation means so that said modulation signal remains within predetermined maximum and minimum limits; and
    means responsive to said modulation signal for providing an output signal.

2. The noise generator of claim 1 wherein said modulation means comprises an integrator means for providing said modulation signal so that said modulation signal comprises a sequence of linear ramps having directions controlled by said pseudorandom sequence.

3. The noise generator of claim 2 wherein said control means comprises:
    detection means responsive to said integrator means for providing a control signal when any of said linear ramps reaches either of said predetermined maximum and minimum limits; and
    switching means responsive to said control signal for reversing the slopes of said linear ramps in response to said control signal.

4. The noise generator of claim 3 wherein said switching means is further responsive to said pseudorandom digital signal and controls the direction of the respective slopes of said linear ramps in response to a logical combination of said pseudorandom digital signal and said control signal.

5. The noise generator of claim 4 wherein said switching means comprises an exclusive-OR gate.

6. The noise generator of claim 2 wherein each of said linear ramps has a substantially constant slope that is either positive or negative.

7. The noise generator of claim 2 wherein said modulation means comprises a slope control means for controlling the absolute value of the slope.

8. The noise generator of claim 1 wherein said modulation means comprises:
second clock means for providing a second clock signal; and
digital means for being responsive to the second clock signal and for providing said modulation signal so that said modulation signal comprises a digital count signal for counting in an up direction and in a down direction at a rate controlled by the second clock signal and for being responsive to said pseudorandom digital signal to change the count direction.

9. The noise generator of claim 8 wherein the second clock means is controllable for controlling the frequency of the second clock signal and thereby controlling the slope of the modulation signal.

10. The noise generator of claim 8 wherein said control means comprises:
detection means responsive to said digital count signal for providing a control signal when said digital count signal reaches either of said predetermined maximum or minimum limits; and
switching means responsive to said control signal for reversing the count direction of said digital means in response to said control signal.

11. The noise generator of claim 10 wherein said detection means includes digital magnitude comparators which compare said digital count signal to said limits and provide said control signal.

12. The noise generator of claim 10 wherein said switching means is further responsive to said pseudorandom digital signal and controls said count direction in response to a logical combination of said pseudorandom digital signal and said control signal.

13. The noise generator of claim 12 wherein said switching means comprises an exclusive-OR gate.

14. The noise generator of claim 8 wherein said means for providing an output signal comprises:
a digital-to-analog converter responsive to said digital count signal for providing an analog modulation signal; and
a voltage controlled oscillator responsive to said modulation signal for providing said output signal.

15. The noise generator of claim 8 wherein said means for providing an output signal comprises:
a digital-to-analog converter responsive to said digital count signal for providing an analog modulation signal;
a low pass filter responsive to said analog modulation signal for providing a filtered signal; and
a voltage controlled oscillator responsive to said filtered signal for providing said output signal.

16. A method for generating a pseudorandom noise output comprising the steps of:
providing a clock signal having a selectable frequency;
generating in response to the clock signal a digital signal having a pseudorandom sequence;
generating in response to the pseudorandom digital signal a linearly changing modulation signal having a direction of change controlled by the pseudorandom sequence;
limiting the modulation signal to remain between predetermined maximum and minimum limits; and
modulating a voltage controlled oscillator with the modulation signal to provide a pseudorandom noise output signal.

17. The method of claim 16 wherein the step of generating the modulation signal includes the step of generating a sequence of linear ramps having positive or negative slopes in response to the pseudorandom digital signal.

18. The method of claim 17 wherein the step of generating a sequence of linear ramps includes the step of integrating a logic signal that is controlled by the pseudorandom digital signal.

19. The method of claim 18 wherein the step of limiting the modulation signal includes the steps of:
detecting the linear ramps and providing a control signal when any of the linear ramps reaches either of the predetermined maximum and minimum limits; and
controlling the slopes of the linear ramps in response to the control signal.

20. The method of claim 19 wherein the step of controlling the slopes of the linear ramps includes the step of controlling the logic signal as a logical combination of the pseudorandom digital signal and the control signal.

21. The method of claim 20 wherein the step of controlling the logic signal includes the step of controlling the logic signal as an exclusive-OR combination of the pseudorandom digital signal and the control signal.

22. The method of claim 16 wherein the step of generating the modulation signal includes the steps of:
providing a second clock signal; and
providing a digital count signal that counts in an up direction or in a down direction in response to the pseudorandom digital signal and at a rate controllable by the second clock signal.

23. The method of claim 22 wherein the step of providing a second clock signal comprises providing a second clock signal with a controllable frequency thereby controlling the slope of the modulation signal.

24. The method of claim 22 wherein the step of modulating a voltage controlled oscillator includes the steps of:
converting the digital count signal to an analog signal; and
modulating the voltage controlled oscillator with the analog signal.

25. The method of claim 24 wherein the step of converting the digital count signal includes the step of low pass filtering the analog signal to provide a filtered analog signal and providing the filtered analog signal to the voltage controlled oscillator.

26. The method of claim 22 wherein the step of limiting the modulation signal comprises the steps of:
comparing the digital count signal to the predetermined maximum and minimum limits and providing a control signal when the digital count signal reaches either; and
controlling the count direction of the digital count in response to the control signal.

27. The method of claim 26 wherein the step of controlling the count direction includes the step of controlling the count direction as a logical combination of the control signal and the pseudorandom sequence.

28. The method of claim 27 wherein the step of controlling the count direction as a logical combination includes the step of controlling the count direction as an exclusive-OR combination of the control signal and the pseudorandom sequence.

* * * * *

UNITED STATES PATENT AND TRADEMARK OFFICE
CERTIFICATE OF CORRECTION

PATENT NO.  : 4,697,157

DATED       : September 29, 1987

INVENTOR(S) : Buddecke et al.

It is certified that error appears in the above-identified patent and that said Letters Patent is hereby corrected as shown below:

Please insert the following paragraph as the first paragraph of the Specification:

"This invention was made with Government support under Contract No. N00024-C-5904 (formerly N00039-80-C-0115) awarded by the Department of the Navy. The Government has certain rights in this invention."

Signed and Sealed this

Fifteenth Day of September, 1992

Attest:

DOUGLAS B. COMER

*Attesting Officer*          *Acting Commissioner of Patents and Trademarks*